(12) United States Patent
Doi

(10) Patent No.: US 8,629,717 B2
(45) Date of Patent: Jan. 14, 2014

(54) POWER CONSUMPTION CONTROL CIRCUIT, AMPLIFIER CIRCUIT AND POWER CONSUMPTION CONTROL METHOD

(75) Inventor: Yoshiaki Doi, Tokyo (JP)

(73) Assignee: NEC Corporation, Tokyo (JP)

( * ) Notice: Subject to any disclaimer, the term of this patent is extended or adjusted under 35 U.S.C. 154(b) by 67 days.

(21) Appl. No.: 13/379,618

(22) PCT Filed: Jun. 30, 2010

(86) PCT No.: PCT/JP2010/061494
§ 371 (c)(1),
(2), (4) Date: Dec. 20, 2011

(87) PCT Pub. No.: WO2011/002099
PCT Pub. Date: Jan. 6, 2011

(65) Prior Publication Data
US 2012/0098602 A1    Apr. 26, 2012

(30) Foreign Application Priority Data
Jul. 3, 2009   (JP) .................................. 2009-158450

(51) Int. Cl.
*H03F 1/14*     (2006.01)

(52) U.S. Cl.
USPC ............................... 330/51; 330/285; 330/280

(58) Field of Classification Search
USPC ............................ 330/51, 136, 285, 280, 278
See application file for complete search history.

(56) References Cited

U.S. PATENT DOCUMENTS 7,031,457 B2 *    4/2006    Melsa ...................... 379/399.01

FOREIGN PATENT DOCUMENTS

| JP | 3-179926 A | 8/1991 |
|---|---|---|
| JP | 6-303043 A | 10/1994 |
| JP | 8-242124 A | 9/1996 |
| JP | 9-46152 A | 2/1997 |
| JP | 2000068753 A | 3/2000 |
| JP | 2001292034 A | 10/2001 |
| JP | 2003264436 A | 9/2003 |
| JP | 2003338712 A | 11/2003 |
| JP | 2008271172 A | 11/2008 |
| JP | 2008301404 A | 12/2008 |

OTHER PUBLICATIONS

International Search Report for PCT/JP2010/061494 mailed Oct. 5, 2010.

* cited by examiner

*Primary Examiner* — Robert Pascal
*Assistant Examiner* — Khiem Nguyen

(57) ABSTRACT

Provided is a power consumption control circuit, an amplifier circuit and a power consumption control method which control the power consumption associated with an amplification action in real time.

A power consumption control circuit of the present invention comprises: a detection means which detects the presence or absence of an input of a digital input signal, spending a first period of time; a signal delay means which delays the digital input signal by a second period of time equivalent to the first period of time, and outputs the delayed signal; a digital-to-analog conversion means which converts the delayed signal into an analog signal, and outputs the analog signal; an amplification means which generates an amplification action when a bias is applied to it; and a bias control means which applies a bias to an amplification device, on the basis of a detection result obtained by the detection means.

34 Claims, 8 Drawing Sheets

POWER CONSUMPTION CONTROL CIRCUIT, AMPLIFIER CIRCUIT AND POWER CONSUMPTION CONTROL METHOD

TECHNICAL FIELD

The present invention relates to power consumption control of an apparatus, and in particular to a power consumption control circuit, amplifier circuit and power consumption control method which can control the power consumption associated with an amplification action in real time.

BACKGROUND ART

In recent years, LTE (Long Term Evolution) has been investigated in 3GPP (3rd Generation Partnership Project) as long-term evolution of a next generation access method. In LTE, the Orthogonal Frequency Division Multiplexing (OFDM) modulation method, which utilizes the orthogonality of frequency, is likely to be employed, in order to increase the efficiency of frequency usage. As an access method there, adoption of the Orthogonal Frequency Division Multiple Access (OFDMA) utilizing OFDM has been investigated. Being different from single carrier-wave systems using single carrier-wave such as the Code Division Multiple Access (CDMA), OFDMA is a multiple carrier-wave system in which the information is transmitted on a carrier wave divided into a plurality of subcarriers each having a narrow frequency bandwidth.

In OFDMA, using its feature that a real-time allocation of wireless resources is possible, a "resource scheduling" has been investigated, in which a "resource block", as a user resource, is flexibly assigned in each of the time domain and the frequency domain.

A method of controlling the assignment of a PDSCH (Physical Downlink Shared Channel) consisting of downward (downlink) data channels in a transmission signal, every unit time of 1 msec called "sub-frame", can be exemplified as a specific example of a resource scheduling in OFDMA in LTE.

Accordingly, in the resource scheduling in LTE, there is a sub-frame to which no PDSCH (Physical Downlink Shared Channel) is assigned, and such a sub-frame is in the state where only a reference signal for piloting is transmitted. The reference signal is transmitted only during a predetermined short period of time within a period for the sub-frame.

When there is a sub-frame which has no PDSCH assigned and accordingly has only a reference signal, the transmission signal becomes intermittent.

In a transmission apparatus, for example, in a system where wireless resources are assigned intermittently, as mentioned above, when a transmission power amplifier is operated continuously, there arises a problem of wasteful power consumption even in a time period where no wireless resource is assigned, which is due to an idling bias of an amplification device. This problem has not been revealed up to now in the case of a continuous single carrier-wave system such as CDMA. However, in the case of applying the resource scheduling in OFDMA, when the ratio of the time period with no resource assignment to the whole time period (the intermittence rate) is large, operational power efficiency averaged over the whole sub-frames declines.

In general, with respect to power consumption reduction of a transmission apparatus at a base station for mobile communication, the technical investigation is conducted not only on the reduction in power consumption at the time of maximum transmission power but also on that in intermittent operation and at standby, from the aspect of reduction of operating expenditure (OpEx) of the system.

There are various technologies for reducing the power consumption in a communication apparatus (Patent Documents 1 and 2 are referred to, for example). In the technologies of Patent Documents 1 and 2, the power consumption at the time of low input level is reduced by changing the bias of a power amplifier in accordance with the transmission level.

There is also a technology in which the power consumption of a power amplifier for OFDM signal amplification is reduced (Patent Document 3 is referred to, for example). The power amplifier of Patent Document 3 delays an OFDM signal, which is subjected to the amplification, by a predetermined period of time, during which the power amplifier judges whether the signal level has exceeded a certain level or not. Based upon a result of the judgment, the drain voltage or bias voltage of the power amplifier is controlled.

CITATION LIST

Patent Literature

[Patent Document 1] Japanese Patent Application Laid-Open No. 1991-179926 (pages 2-3, FIG. 1)
[Patent Document 2] Japanese Patent Application Laid-Open No. 1997-46152 (pages 2-3, FIG. 1)
[Patent Document 3] Japanese Patent Application Laid-Open No. 2001-292034 (pages 2-3, FIG. 1)

DISCLOSURE OF INVENTION

Technical Problem

Each of the disclosed technologies mentioned above has a problem. Specifically, in the technologies of Patent Documents 1 and 2, a processing time which is necessary to detect an input signal level is not considered. More specifically, in the technologies of Patent Documents 1 and 2, even when an input signal level changed, the input signal after the level change is amplified keeping the bias voltage the same, as that before the level change, until the level change is detected and accordingly the bias voltage is changed.

In a period where no signal is inputted, that is, where the input signal level is null, for example, it is desirable to pinch off an amplification device in the amplifier by controlling the bias voltage, and thus to reduce the power consumption of the amplifier. However, in the technologies of Patent Documents 1 and 2, the bias voltage is kept applied due to a response delay of the bias voltage control, and accordingly the power is consumed wastefully.

The "pinch off" in this specification means suspending an amplification action of the amplification device. The amplification device generates an amplification action when it is not in a pinch-off state.

On the other hand, when an input of a signal is started during the state with no signals inputted, that is, when the input signal level changes from zero to a finite value, activation of the amplifier needs to be performed by immediately applying a bias voltage. The "activation" means the state where the operation is possible. However, when the activation of the amplifier is delayed due to a response delay of the bias voltage control, a problem arises in that the front portion of the inputted signal is not amplified.

Thus, both of the technologies of Patent Documents 1 and 2 have a problem in that they cannot be applied to a system in which power consumption could be reduced by means of real-time control of the state of a transmission power amplifier, such as the above-described system utilizing OFDMA.

In Patent Document 3, there is no description of the above-described problem which is specific to when the technology is applied to a system which could be capable of reducing the power consumption by real-time control of the state of a transmission power amplifier, and of a method to solve the problem. In the power amplifier of Patent Document 3, the power consumption is reduced by controlling the drain voltage or bias voltage of the power amplifier. Accordingly, in order to control the power consumption of the power amplifier in real time, high-speed control of the drain voltage or bias voltage is indispensable. However, in general, high-speed change or control of drain voltage is difficult. The reason will be described below.

There are two kinds of method, in general, which are considered to be a method to control drain voltage. The first method is a method which suspends the switching of a switching regulator employed in a DC power supply generating a voltage. The second method is a method in which a switching element provided at a section subsequent to a DC power supply switches off the voltage.

The first method has a problem of difficulty in high-speed on/off control of a power supply. Switching regulators have a restriction that it is necessary at the start-up to execute a control which gradually increases the duty of switching, which is the so-called "soft-start". Switching frequency of a switching regulator of current technology is in the order of a few hundred kHz. Accordingly, when the soft-start is executed, it takes a power supply voltage a time in the order of a few msec to start up. Since a long period of time is thus necessary for the start-up of a power supply, on/off control of a voltage in the order of a few microseconds, for example, is difficult.

In the case of the second method, there is a problem of increase in size of the parts and circuits which are necessary for on/off switching of a drain voltage. In particular, switching of high voltage and high current is necessary for the on/off switching of a drain voltage. Accordingly, from the aspect of a restriction of withstanding voltage and withstanding current-capacity of a switching device, the aspect of power loss of the switching device, and the aspect of charge-discharge endurance of a capacitor, the sizes of the switching device and other parts increase, and consequently the size of the circuit increases.

As described above, high-speed control of a drain voltage is difficult by means of a usual method. In order to reduce the power consumption of a system to the limit, it is essential to control the voltage in real time. However, in Patent Document 3, there is no description of necessity, problem and its solution method of such voltage control. Further, in Patent Document 3, it is described that the equivalent effect is obtained when the bias voltage is controlled instead of the drain voltage, but, because no consideration is given to a means for high-speed control of the drain voltage, it is apparent that any high-speed control is not considered, either, with respect to the means for controlling the bias voltage. Accordingly, Patent Document 3 is not a means aimed at the high-speed control of a power supply voltage.

Further, the technology of Patent Document 3 has a problem of the accuracy of control. In order to accurately synchronize a change in the state of an amplifier (the power supply voltage or bias voltage of the power amplifier, in the case of Patent Document 3) with a change in the input level of a signal, preciseness is required of the signal delay time. In Patent Document 3, described are a method which delays a signal keeping it as an analog signal, and a method combining an analog-digital (referred to as A/D, hereafter) conversion, delaying by digital processing and digital-analog (referred to as D/A, hereafter) conversion. The former method has problems of the accuracy of delay time and of easiness of realization. The latter method has problems of the necessity of the use of a high-speed converter for both of the A/D and D/A conversions, for increasing the accuracy of delay time, and of an increase in circuit scale due to the necessity of two converters. The use of a high-speed converter and that of a plurality of converters pose serious problems in power consumption and cost. In contrast, such problems do not arise, when the signal-delaying is applied to a digital signal. However, no description is given in Patent Document 3 of the necessity and effect of performing the signal-delaying by means of only digital processing.

Objective of Invention

The present invention has been made in view of the above-mentioned technical problems, and the objective of the present invention is to provide a power consumption control circuit, an amplifier circuit and a power consumption control method, which control the power consumption associated with an amplification action in real time.

Solution to Problem

A power consumption control circuit of the present invention is characterized in that it comprises: a detection means which detects the presence or absence of an input of a digital input signal, spending a first period of time; a signal delay means which delays the digital input signal by a second period of time equivalent to the first period of time, and outputs the delayed signal; a digital-analog conversion means which converts the delayed signal into an analog signal, and outputs the analog signal; an amplification means which generates an amplification action when a bias is applied to it; and a bias control means which applies a bias to an amplification device, on the basis of a detection result obtained by the detection means.

An amplifier circuit of the present invention is characterized in that it comprises: a detection circuit which detects the presence or absence of an input of a digital input signal, spending a first period of time; a signal delay circuit which delays the digital input signal by a second period of time equivalent to the first period of time, and outputs the delayed signal; a digital-analog conversion circuit which converts the delayed signal into an analog signal, and outputs the analog signal; an amplification device which generates an amplification action when a bias is applied to it, and amplifies the analog signal; and a bias control circuit wherein the bias control circuit includes a switching device for applying a bias which makes connection or disconnection between a predefined power supply for biasing and the amplification device, and also includes a switching device for removing a bias which makes connection or disconnection between the amplification device and a non-bias potential set at the state of no bias application, and the bias control circuit starts or suspends the application of a bias voltage to the amplification device, on the basis of a detection result obtained by the detection means.

A power consumption control method of the present invention is characterized in that it comprises: a detection process to detect the presence or absence of an input of a digital input signal, spending a first period of time a signal delay process to delay the digital input signal by a second period of time equivalent to the first period of time, and output the delayed signal; a digital-analog conversion process to convert the delayed signal into an analog signal, and output the analog signal; and a bias control process to apply a bias to an amplification device, on the basis of a detection result obtained by the detection means, and make it generate an amplification action.

Advantageous Effects of Invention

A power consumption control circuit, amplifier circuit, power consumption control method and amplification method of the present invention have an advantageous effect of making it possible to control the power consumption associated with an amplification action in real time.

DESCRIPTION OF EMBODIMENTS

The First Exemplary Embodiment

Figure 1:
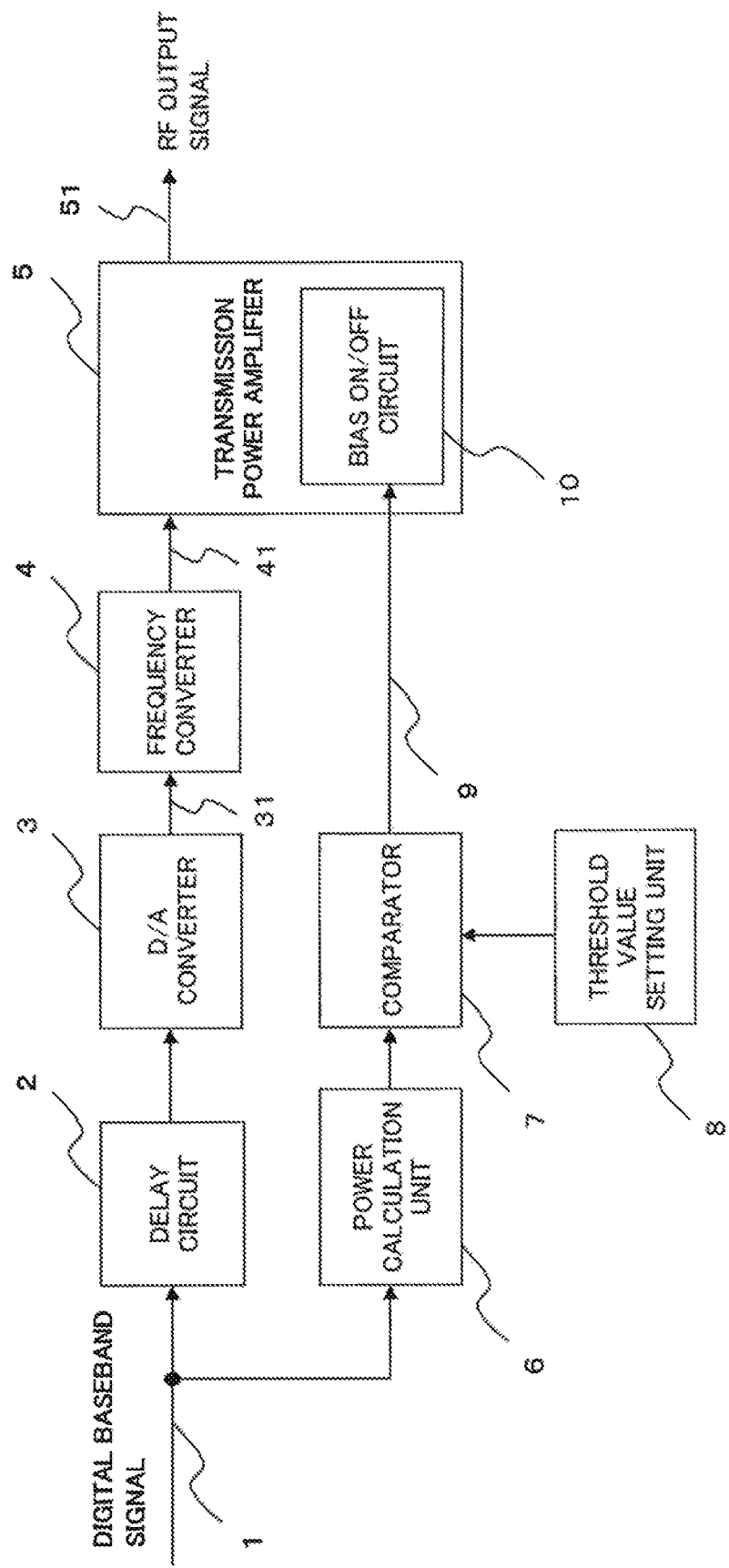
FIG. 1 is a block diagram showing a configuration of a power consumption control circuit of the first exemplary embodiment.

Next, the first exemplary embodiment of the present invention will be described with reference to the drawings. FIG. 1 is a block diagram showing a configuration of a power consumption control circuit of the first exemplary embodiment. This power consumption control circuit has a function to control the power consumption of a transmission power amplifier.

This power consumption control circuit includes a delay circuit 2, a D/A converter 3, a frequency converter 4 and a transmission power amplifier 5, which constitute a main signal section, and also includes a power calculation unit 6, a comparator 7, a threshold value setting unit 8 and a bias on/off circuit 10, which constitute a processing section.

First, the functions of the respective components of the main signal section will be described. The delay circuit 2 adds a predetermined delay to an inputted digital baseband signal 1. The added delay time will be described later. The D/A converter 3 converts the delayed digital baseband signal 1 into an analog baseband signal 31. The frequency converter 4 converts the analog baseband signal 31 into an RF (Radio Frequency) input signal 41. The transmission power amplifier 5 performs power amplification of the RF input signal 41 and outputs an RF output signal 51.

Next, the functions of the respective components of the processing section will be described. The power calculation part 6 calculates the power of the digital baseband signal 1 which branched out at the input end. The comparator 7 compares a result of the power calculation and a threshold power value which is set in the threshold value setting section 8, and thereby judges the presence or absence of the digital baseband signal 1. Then, it outputs a bias on/off signal 9 in accordance with a result of the judgment. Specifically, it outputs the bias on/off signal 9 so that the bias is switched into the ON state when the digital baseband signal 1 is judged to be present, and the bias is switched into the OFF state when the digital baseband signal 1 is judged to be absent. The bias on/off circuit 10 controls the on/off state of the bias of the transmission power amplifier 5, in accordance with the bias on/off signal 9.

Description will be given of the delay time which is added to the digital baseband signal 1 by the delay circuit 2. In the delay circuit 2, a delay time equivalent to a processing time for the processes from the power calculation to the bias on/off control, which is performed in the processing section, is added to the digital baseband signal 1. In this way, the timing of the bias on/off switching in the transmission power amplifier 5 is synchronized with the input timing of the RF input signal 41 to the transmission power amplifier 5.

Figure 4:
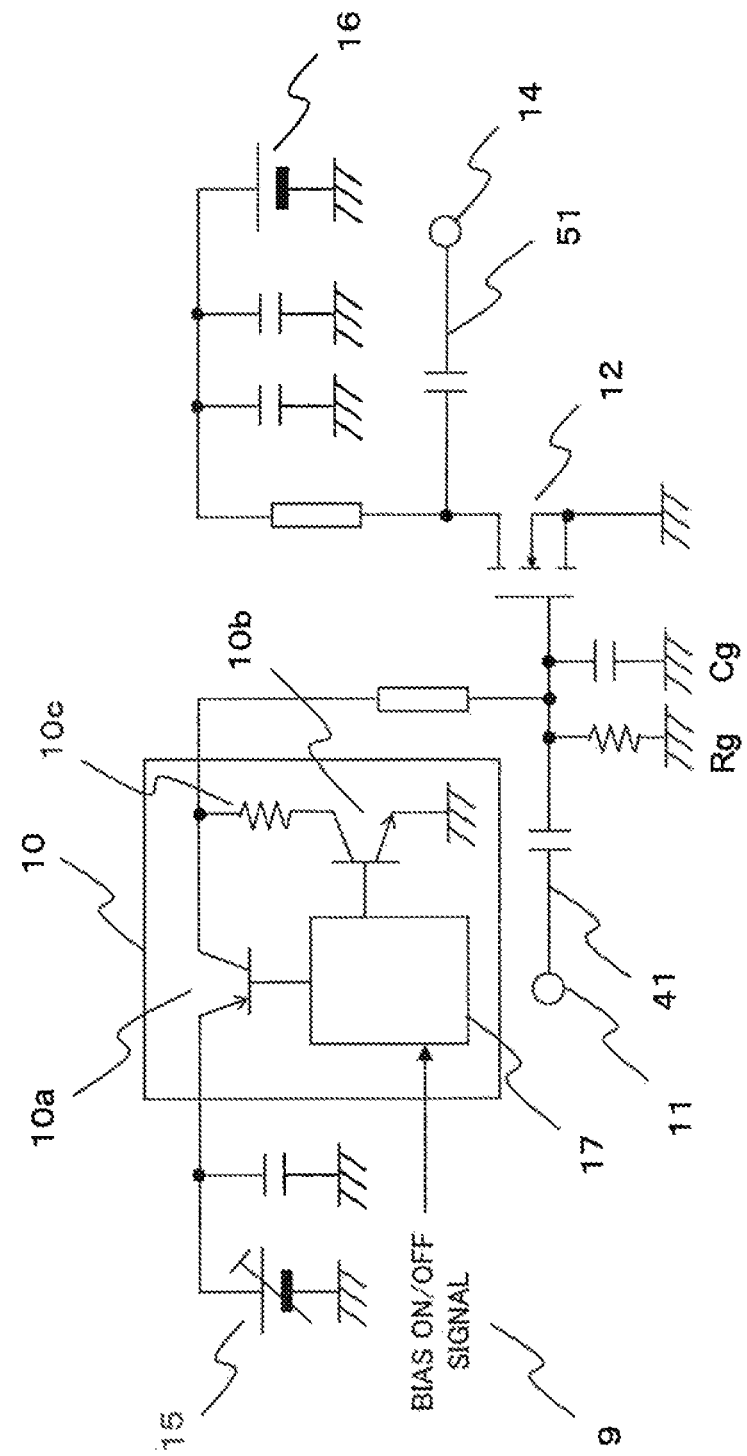
FIG. 4 is a block diagram showing an example of a configuration of a bias on/off circuit employing an MOS field effect transistor.
Figure 5:
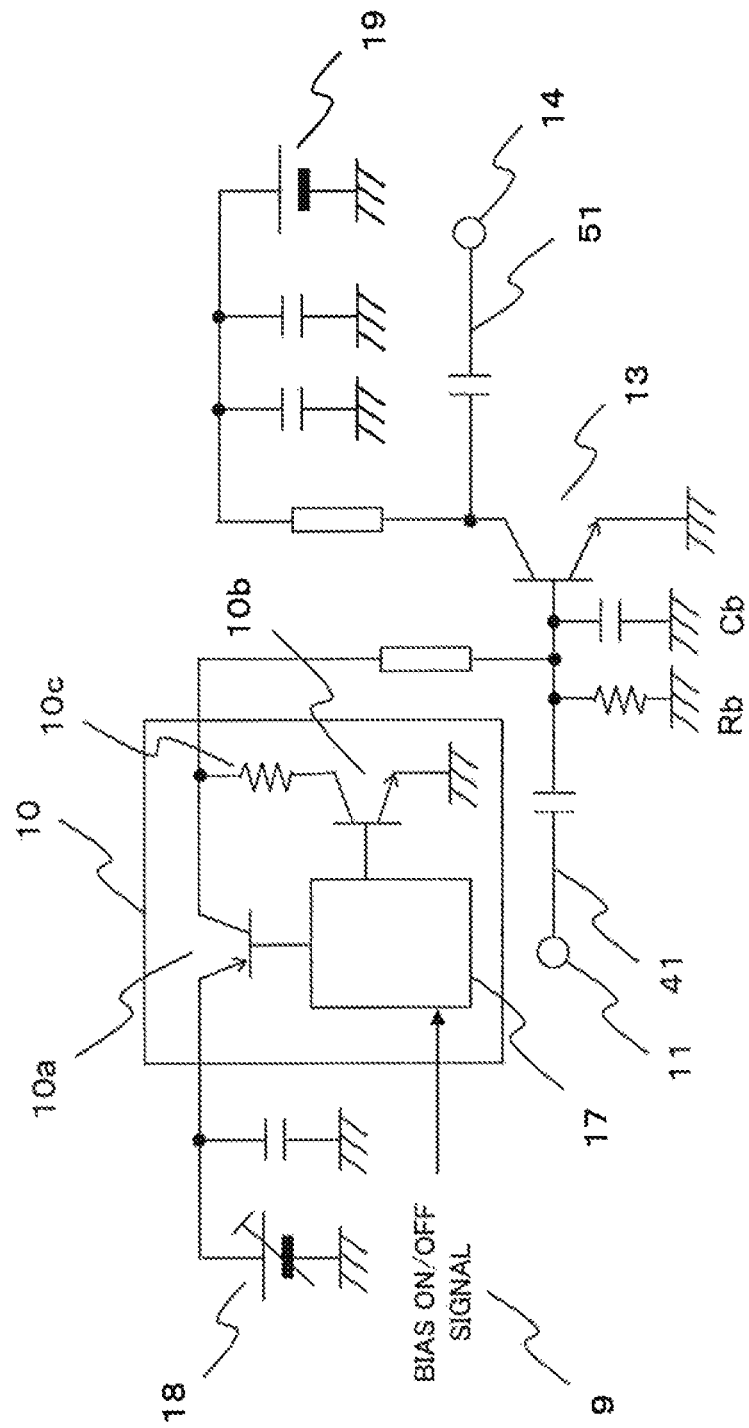
FIG. 5 is a block diagram showing an example of a configuration of a bias on/off circuit employing a bipolar transistor.

FIGS. 4 and 5 are block diagrams showing examples of a configuration of the transmission power amplifier 5 to which the bias on/off circuit 10 is connected. An MOS (Metal Oxide Semiconductor) field effect transistor is employed in the transmission power amplifier in FIG. 4, and a bipolar transistor is employed in the transmission power amplifier in FIG. 5.

The bias on/off circuit 10 includes a bias application/discharge switching control circuit 17, a switching device for bias application 10a and a switching device for bias discharge 10b. The bias application/discharge switching control circuit 17 functions in accordance with the bias on/off signal 9. The switching device for bias application 10a and the switching device for bias discharge 10b are controlled by a drive signal provided from the bias application/discharge switching control circuit 17.

Figure 2:
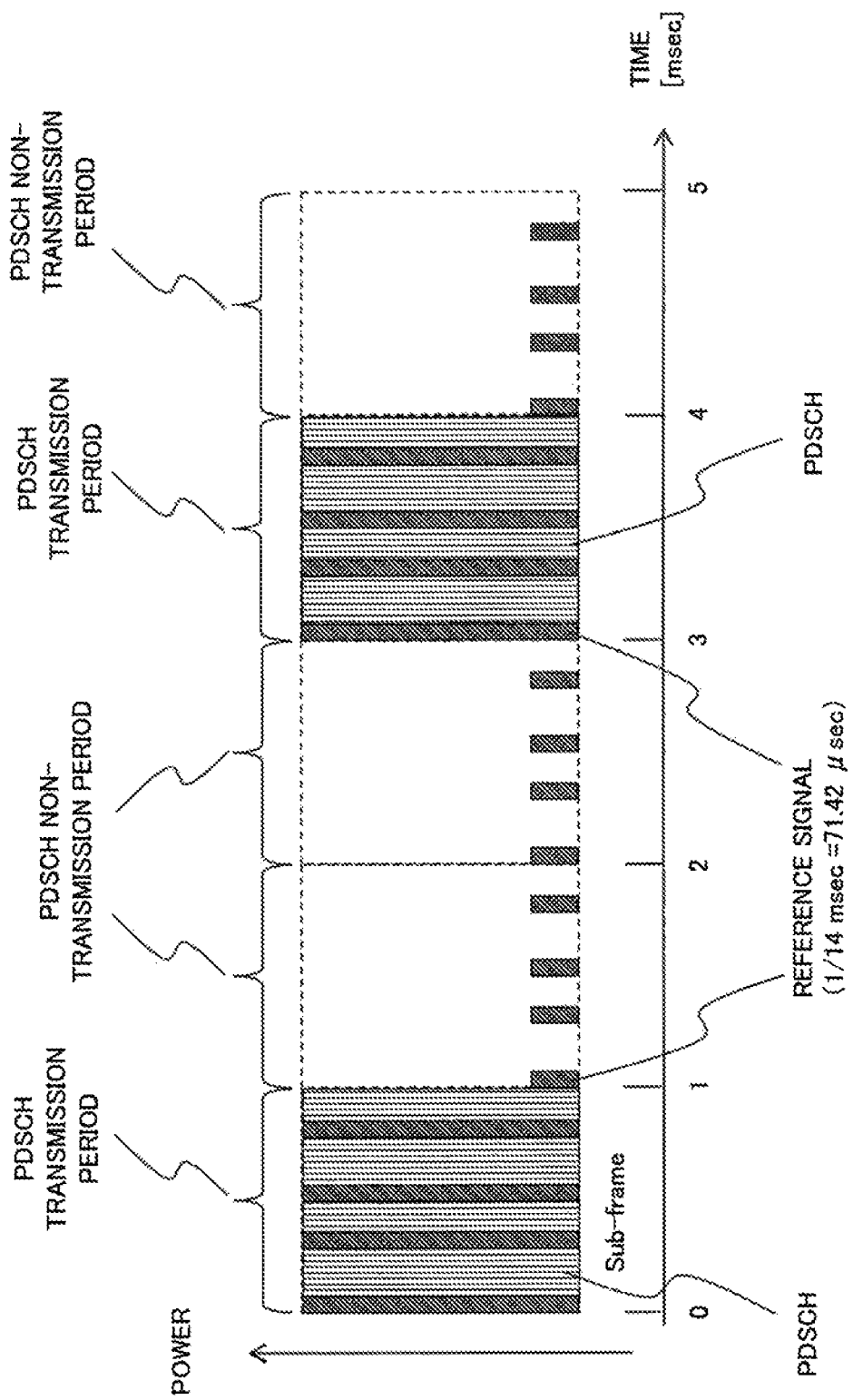
FIG. 2 is a diagram showing an example of resource scheduling in the time domain.

Here, the resource scheduling in LTE will be described. FIG. 2 shows an example of resource scheduling in the time domain for OFDMA in LTE. As described above, in the resource scheduling in LTE, there is a sub-frame to which no PDSCH is assigned as a resource, and only a reference signal is transmitted in such a sub-frame. The reference signal is transmitted during only a predetermined short period of time, and the transmission power is substantially lower compared to when a PDSCH is transmitted. Accordingly, the average value for the transmission power over the sub-frame is very small.

Complementary description will be given below of the reference signal in LTE. As an example, a typical reference signal has a duration of 1/14 [msec] (=71.42 microseconds). The reference signal is used by a mobile terminal side for measuring a CQI (Channel Quality Indicator). Therefore, it needs to be transmitted to a mobile terminal from the base station before a resource block is assigned to a PDSCH in the resource scheduling. Accordingly, a reference signal is transmitted even in a sub-frame where no PDSCH is transmitted.

Further, in a period of PDSCH transmission, that is, in a sub-frame where a PDSCH is transmitted, the PDSCH is continuously transmitted. Accordingly, within the period of PDSCH transmission, during a period where a reference signal is transmitted, both PDSCH and the reference signal are transmitted. However, they are transmitted using different frequencies.

Similarly, before the assignment of a PDSCH as a resource block, from the base station, transmitted are P-SS (Primary Synchronization Signal), S-SS (Secondary Synchronization Signal), PBCH (Physical Broadcast Channel), PDCCH (Physical Downlink Control Channel), PCFICH (Physical Control Format Indicator Channel) and Physical Hybrid ARQ Indicator Channel: they are transmitted in a specific slot, and are composed of the signals corresponding to a few symbols.

In the present exemplary embodiment, as shown in FIG. 2, the situation is assumed, as the severest condition, as that the power consumption control is executed on a sub-frame in which only a reference signal is transmitted and accordingly the duration of signal transmission is shortest. That is, in the present exemplary embodiment, control is conducted in such a way that, in a period where no PDSCH is assigned, a reference signal of the shortest duration is transmitted, and the bias of the transmission power amplifier is switched off during the period where the reference signal is not transmitted. Thus controlling, the power consumption in the standby state, where no signal is transmitted, is reduced.

Operation of the power consumption control circuit of the first exemplary embodiment will be described below, with reference to the drawings. In the main signal section, after receiving a delay added in the delay circuit 2, the inputted digital baseband signal 1 is converted into an analog baseband signal 31 in the D/A converter 3, and is further converted into an RF input signal 41 in the frequency converter 4. The converted RF input signal 41 is amplified up to required power in the transmission power amplifier 5, and is outputted as an RF output signal 51.

In the processing section, first, with respect to the digital base band signal 1 which branched out from the main signal section, summation and averaging of sampled values for the power during a specific period of time are executed, and accordingly the average power is calculated. Specifically, when a digital baseband signal 1 consists of components I and Q, the power can be obtained by calculating $I^2+Q^2$ with respect to the sampled values for I and Q. Then, the average power is obtained by summing up a plurality of calculated values for the power and then dividing the resultant value by the number of times of sampling.

Next, in the comparator 7, by comparing the calculation result of the average power with a threshold power value which is set in the threshold value setting unit 8 in advance, the presence or absence of the digital baseband signal 1 is judged. Further in the comparator 7, in accordance with the judgment result, the bias on/off signal 9 is generated so that: the bias of the transmission power amplifier 5 is controlled to be in the ON state, when a signal is judged to be present; and the bias is controlled to be in the OFF state, when a signal is judged to be absent; and it is outputted to the transmission power amplifier 5. In the bias on/off circuit 10 within the transmission power amplifier 5, the on/off of the bias of the amplification device is controlled in accordance with the bias on/off signal 9.

In the delay circuit 2 of the main signal section, a delay time which is equivalent to the processing time for the above-mentioned processes in the processing section is added to the baseband signal. This addition of the delay time makes it possible to synchronize the timing of the bias on/off switching with the input timing of a signal to the transmission power amplifier, and accordingly to amplify and transmit the RF input signal 41 within the period during which the bias inside the transmission power amplifier 5 is in the ON state.

Figure 3:
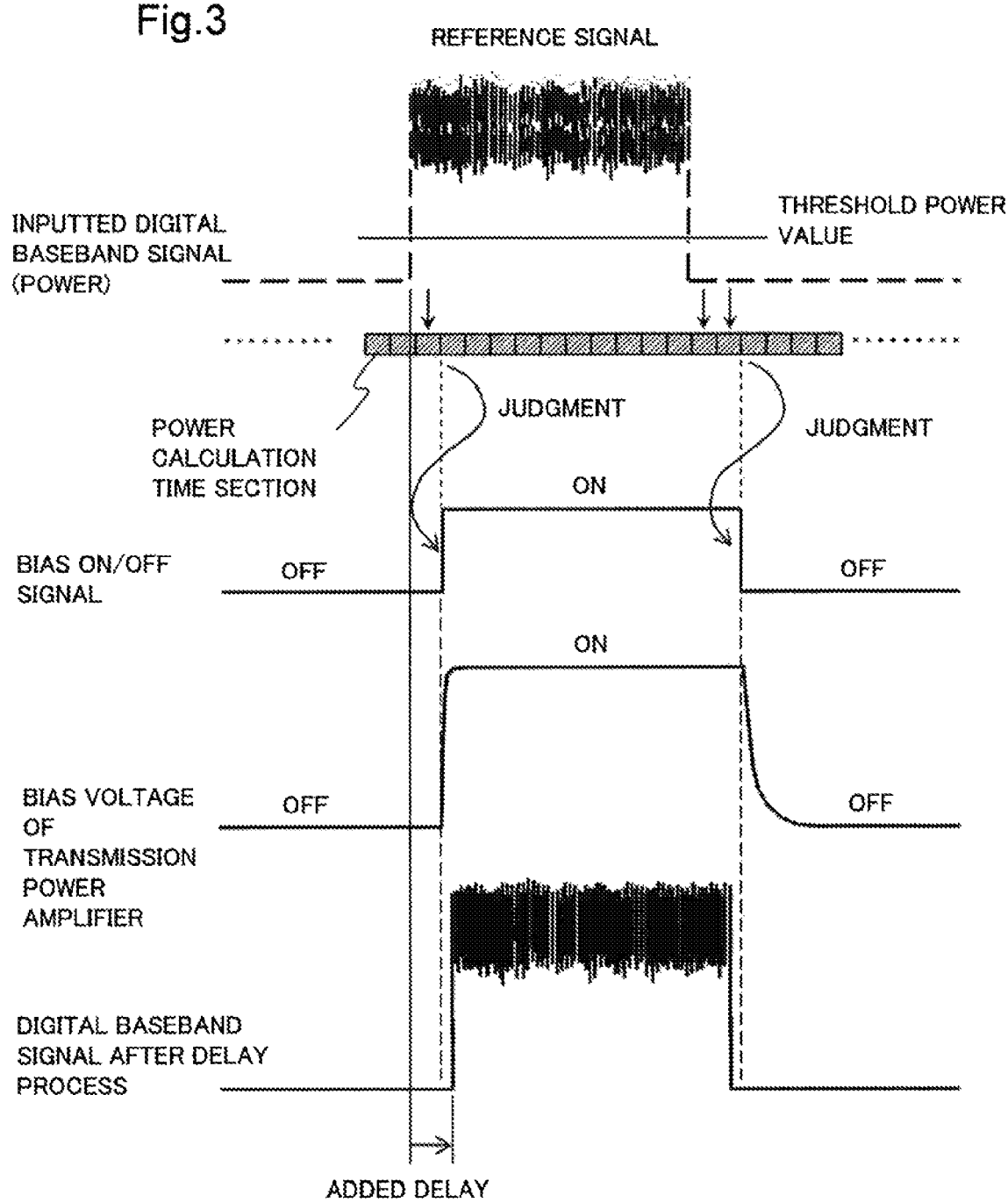
FIG. 3 is a diagram showing the operation of a power consumption control circuit of the first exemplary embodiment when a reference signal is transmitted.

FIG. 3 shows the operation of the power consumption control circuit of the present exemplary embodiment when a reference signal is transmitted in the resource scheduling of OFDMA. As described above, an example is shown for the case where only a reference signal is transmitted, as a case of transmitting a signal of the smallest signal duration.

First, in the power calculation unit 6, on the inputted digital base band signal 1, summation of the power values sampled at a specific time interval and calculation of an average value are executed in terms of a power calculation time section shown in FIG. 3, and thereby the average power over the section is calculated. In order to obtain the average power, for example, a time of 2.083 microseconds is required when the summation is made on 256 sample values sampled at 122.88 MHz, and that of 4.167 microseconds on 512 sample values. Because the power calculation time section affects the delay time which is added to the main signal section, it is determined by a sample number satisfying the accuracy required in terms of calculating the average power at a certain sampling frequency, and also by a restriction of the delay time which is acceptable to the system.

The power calculation performed by the power calculation unit 6 may be substituted with amplitude calculation, and accordingly the threshold value set in the threshold value setting unit 8 may be changed to that of amplitude. In this case, the presence or absence of the digital baseband signal 1 comes to be judged by comparing the amplitude of the digital baseband signal 1 with the threshold value. The amplitude of the digital baseband signal 1 can be obtained by calculating a square root of the above-mentioned $I^2+Q^2$. Thus, in the present exemplary embodiment, the presence or absence of the digital baseband signal 1 is detected by calculating the power or the amplitude of the digital baseband signal 1 and comparing the calculated value with a predetermined value. A calculation result on any parameter other than the power and the amplitude can be employed, if it is a parameter which can be used for detection of the presence or absence of the digital baseband signal 1. On the basis of the result, the presence or absence of the digital baseband signal 1 is detected.

Next, comparing the calculation result of the power with a threshold power value, the signal is judged to be present when the former is equal to or more than the latter, and to be absent when the former is less than the latter. When making the judgment, instead of judging by a result of one comparison, a judgment result may be finalized on obtaining the same comparison result a plurality of times successively. FIG. 3 shows an example where the judgment of signal presence is finalized by one comparison and that of signal absence is finalized by two comparisons. The processing scheme in which a judgment result is thus finalized on the basis of successive multiple-time comparison results is particularly effective, in the case where the power calculation time section is short, when the period of no resource assignment, that is, the period in which no signal is transmitted, is short. It is because, a decrease in the power for a short period is obscured as a result of the averaging, and accordingly does not appear in a change in the average value, which consequently gives rise to a possibility that the decrease in the power cannot be detected.

The number of times of the comparison and judgment also affects the delay time added to the main signal section, and accordingly it is also determined by a restriction of the delay time which is acceptable to the system. Each value described above is an example, and any value can be set within a restricted range.

Then, in accordance with the above-described judgment result on the presence or absence of a signal, the comparator 7 generates a bias on/off signal 9 such as that shown in FIG. 3, and outputs it to the transmission power amplifier 5.

Complementary description will be given below of a set value of the delay time. In the present exemplary embodiment, important is the relation between the input timing of the RF input signal 41 to the transmission power amplifier 5 and the timing of the on/off change of the bias signal of the transmission power amplifier 5, finally. That is, the delay time and the number of judgments need to be set, so that the bias of the transmission power amplifier 5 be ON just before the RF input signal 41 is inputted to the transmission power amplifier 5, and be OFF immediately after the completion of the input of the RF input signal 41 to the transmission power amplifier 5.

Next, the bias on/off circuit 10 will be described with reference to FIGS. 4 and 5. FIG. 4 is a block diagram showing an example of a configuration of the bias on/off circuit 10 of the transmission power amplifier 5 employing an MOS field effect transistor. An MOS field effect transistor 12, which is an amplification device, amplifies the RF input signal 41 inputted from an RF input terminal 11 and outputs the RF output signal 51 from an RF output terminal 14. The gate bias voltage of the MOS field effect transistor 12 is supplied from a gate bias DC power supply 15, and the drain bias voltage from a drain bias DC power supply 16.

FIG. 5 is a block diagram showing an example of a configuration of the bias on/off circuit 10 of the transmission power amplifier 5 employing a bipolar transistor. A bipolar transistor 13, which is an amplification device, amplifies the RF input signal 41 inputted from the RF input terminal 11 and outputs the RF output signal 51 from the RF output terminal 14. The base bias voltage of the bipolar transistor 13 is supplied from a base bias DC power supply 18, and the collector bias voltage from a collector bias DC power supply 19.

As a method to zero the drain current in the case of the MOS field effect transistor 12 and that to zero the collector current in the case of the bipolar transistor 13, the methods in which the drain bias voltage and the collector bias voltage, respectively, are switched off can be considered. Two types of methods are considered as such methods in which the bias voltage itself is switched off. Specifically, as a first method, there is a method in which the switching of a switching regulator employed in the bias DC power supply is suspended. As a second method, there is a method in which the bias voltage is switched off by providing a switching device at a section after the DC power supply.

The first method has a problem of difficulty in high-speed on/off control. As described above, since a switching regulator requires a soft-start to be performed at the start-up, it takes the power supply voltage a time in the order of a few msec to rise. Due to that, high-speed on/off control is difficult. Further, even the second method has a problem in that, as described above, the parts and circuits must be large in size for the purpose of supply and shut-off of high voltage and high current.

In the present exemplary embodiment, in order to avoid the above-mentioned problem, by switching off the gate bias and the base bias, respectively in the case of the MOS field effect transistor 12 and that of the bipolar transistor 13, each transistor is pinched off. The meaning of "pinch off" is as defined above. Thereby, zeroed is the drain current in the case of the MOS field effect transistor 12, and the collector current in the case of the bipolar transistor 13.

Hereafter, in the present exemplary embodiment, examples respectively employing a MOS field effect transistor and a bipolar transistor are shown. Any amplification device other than a MOS field effect transistor and a bipolar transistor is similarly applicable to the present exemplary embodiment, if it is a device of the type which can be pinched off by switching off the bias voltage or bias current. The bias here denotes a bias applied to a signal input terminal. The signal input terminal is the gate in the case of the MOS field effect transistor 12 and is the base in the case of the bipolar transistor 13.

As shown in FIG. 4, when the amplification device of the transmission power amplifier 5 is the MOS field effect transistor 12, the bias on/off circuit 10 is provided with a capacitor Cg in the very vicinity of the gate terminal. When the amplification device of the transmission power amplifier 5 is the bipolar transistor 13, as shown in FIG. 5, the bias on/off circuit 10 is provided with a capacitor Cb in the very vicinity of the base terminal. In those cases, in general, a discharging resistors Rg and Rb are connected in parallel to Cg and Cb, respectively. Since the values for Rg and Rb are in the order of kilo-ohms, when the bias voltage is switched off, the charges on Cg and Cb cannot be discharged at high speed with only Rg and Rb, respectively. Therefore, the high-speed pinch-off, where the bias voltage is switched on and off precisely following the reference signal having a duration as short as 71.42 microseconds, is difficult to realize.

This problem will be described below using specific values for the capacitor and resistor. For example, in the case of the MOS field effect transistor 12, it is supposed that Cg=0.1 μF and Rg=1 kΩ. In this case, if the charges on Cg are discharged with only Rg when the bias is switched off during the state where a gate voltage of 3V is applied, a time of about 40 microseconds is necessary for the gate voltage to decrease to 2V, which is a pinch-off voltage. The pinch-off voltage is referred to as the maximum value of the gate voltage necessary to pinch off the MOS field effect transistor 12. Accordingly, in order to realize the high-speed pinch-off, the bias on/off circuit 10 in FIG. 4 is provided with the switching device for bias discharge 10b as a means to discharge the charges on Cg when the bias is switched off.

The discharging resistor 10c inserted in series to the switching device for bias discharge 10b is employed, so as to guard the switching device for bias discharge 10b when the charges on the capacitor are discharged with the switching device for bias discharge 10b. The value of the discharging resistor 10c is set within a range not affecting a required discharge time constant.

The switching device for bias application 10a and the switching device for bias discharge 10b are controlled by a drive signal provided from a bias application/discharge switching control circuit 17. Specifically, when the bias is ON, the switching device for bias application 10a is controlled to be ON, and the switching device for bias discharge 10b to be OFF. When the bias is OFF, the switching device for bias application 10a is controlled to be OFF, and the switching device for bias discharge 10b to be ON.

On/off timing of the switching device for bias application 10a and that of the switching device for bias discharge 10b need to be reverse to each other. That is, desirable are a complete coincidence between a switch-on timing of the switching device for bias application 10a and a switch-off timing of the switching device for bias discharge 10b, and that between a switch-off timing of the switching device for bias application 10a and a switch-on timing of the switching device for bias discharge 10b. It is because, by eliminating a period in which the switching device for bias application 10a and the switching device for bias discharge 10b are simultaneously on, it is possible to prevent occurrence of the power loss due to direct current flowing from the bias power supply 18 to the ground during an on/off transition. Accordingly, as the switching device for bias application 10a and the switching device for bias discharge 10b, it is desirable to use a complementary-pair type device, that is, a pair of switching devices in which the two switching devices operate complementarily in such a way that when one of them is switched on the other is switched off. When bipolar transistors are used as the switching device for bias application 10a and the switching device for bias discharge 10b, they are desired to be p-n-p type and n-p-n type, respectively. In the case of MOS field effect transistors, it is desirable to use a p-channel type and an n-channel type transistors.

When a complementary-pair type device cannot be used, in the bias application/discharge switching control circuit 17, it would be effective to set a dead time, during which both the switching device for bias application 10a and the switching device for bias discharge 10b are off, to the drive signal of each switching device. By performing such timing control, it is possible to prevent occurrence of the power loss due to a situation where the two switching devices are both short-circuited during the on/off transition period.

As described above, the bias application/discharge switching control circuit 17 outputs a drive signal, in accordance with the bias on/off signal 9, so that either one of the switching device for bias application 10a and the switching device for bias discharge 10b is switched on and the other is off. Further, the switching devices may be controlled so as to be switched off together at the time of switching between on and off. As it is easy for those skilled in the art to design the bias application/discharge switching control circuit 17 provided with such a function, detailed description will be omitted.

Figure 6:
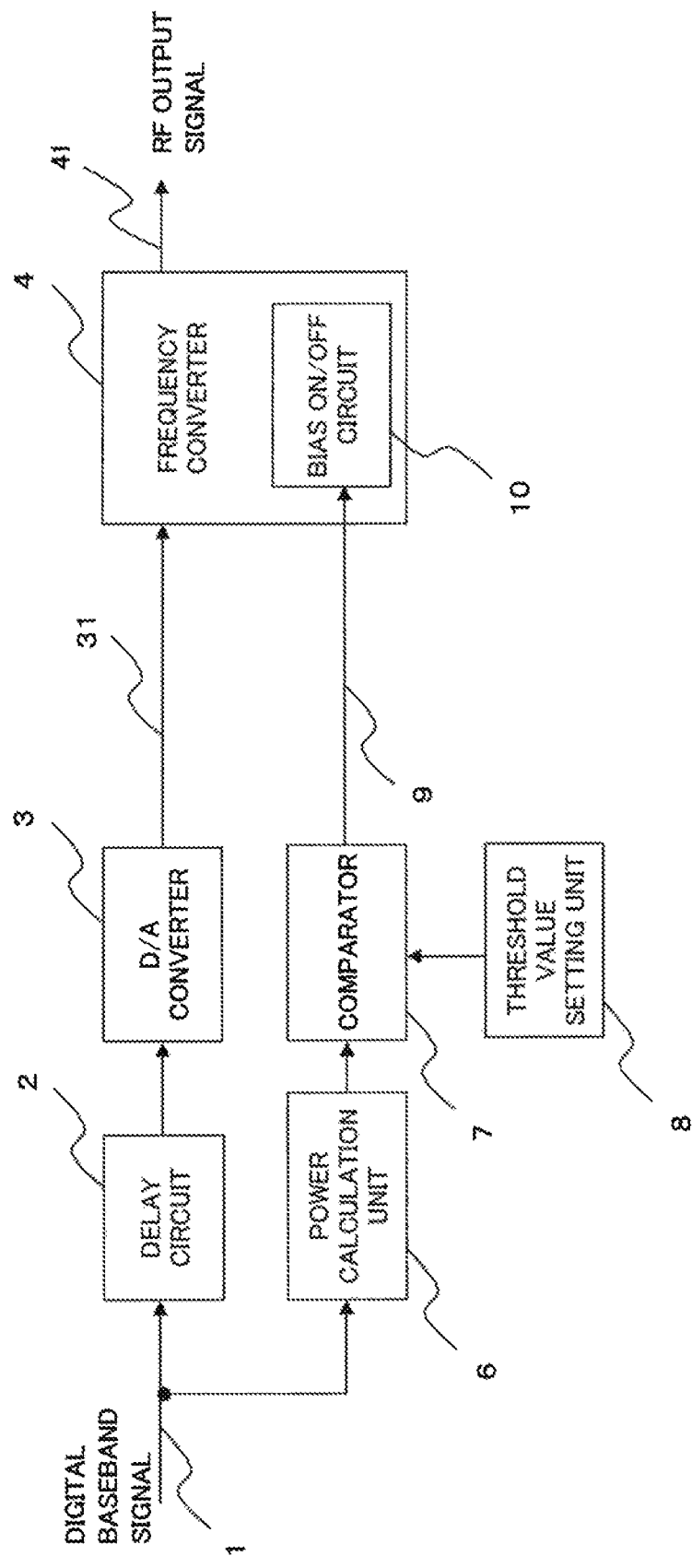
FIG. 6 is a block diagram showing a configuration of a modified example of a power consumption control circuit of the first exemplary embodiment.

In the first exemplary embodiment, an example of application of the present invention to power consumption control of a transmission power amplifier has been shown. When an amplification device is also included within the frequency converter 4, the power consumption control circuit of the first exemplary embodiment can be applied also to the frequency converter 4. FIG. 6 shows a configuration when applying the power consumption control to an amplification device which the frequency converter 4 includes. The power consumption control circuit in FIG. 6 is obtained by removing the transmission power amplifier 5 from the configuration in FIG. 1, and disposing the bias on/off circuit 10 within the frequency converter 4. As the functions and actions of the components in FIG. 6 are the same as that of the respectively corresponding components in FIG. 1, their description will be omitted. As has been described above, the power consumption control circuit of the present exemplary embodiment is applicable to consumption power control of an apparatus which includes an amplification device inside and performs a predetermined process, such as a transmission power amplifier.

Figure 7:
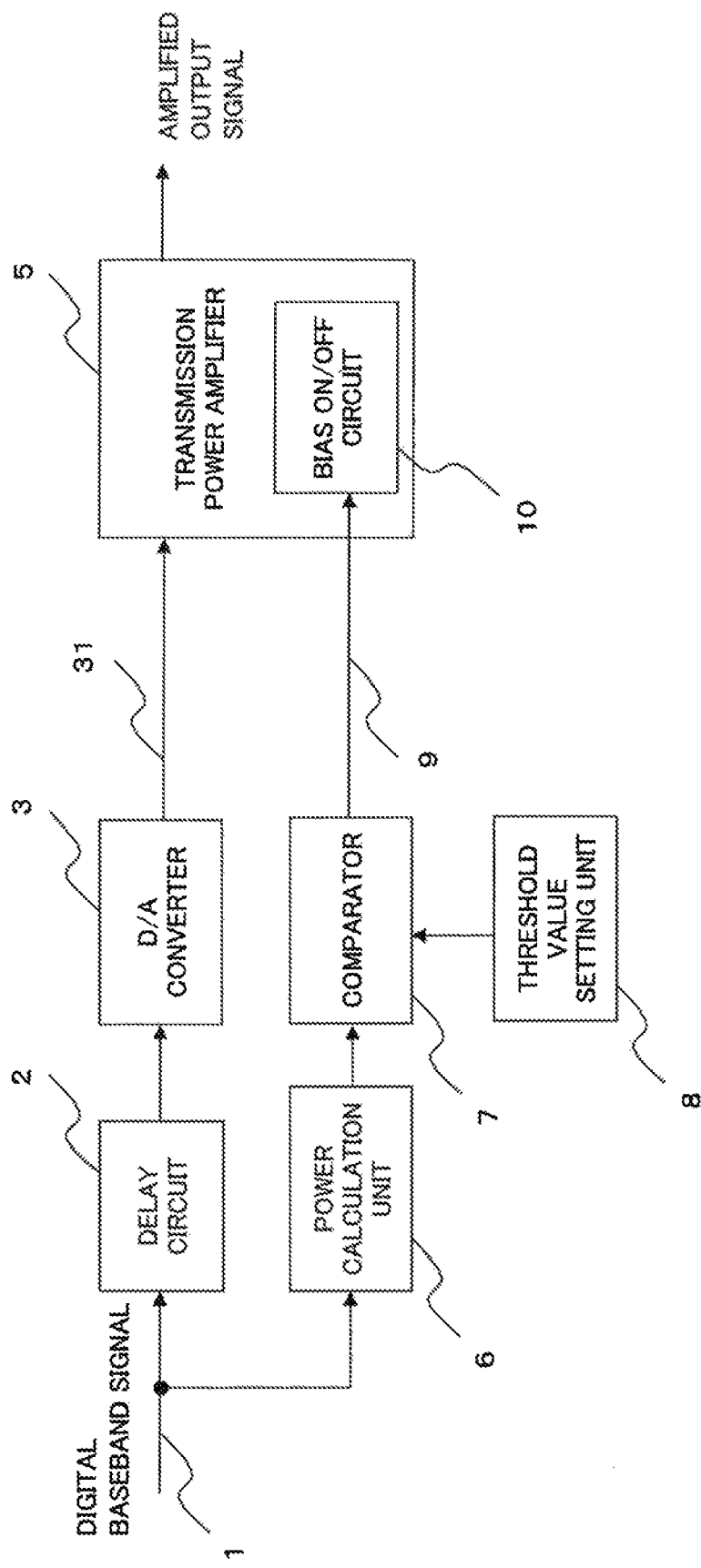
FIG. 7 is a block diagram showing a configuration of another modified example of a power consumption control circuit of the first exemplary embodiment.

Further, it would be needless to say that the frequency converter 4 may be removed, as in FIG. 7, from the configuration in FIG. 1. That is, it is obvious that the power consumption control circuit of the present exemplary embodiment is applicable to a transmission power amplifier which is not provided with a frequency converter and performs only power amplification.

As has been described above, in the power consumption control circuit of the first exemplary embodiment, the bias of the transmission power amplifier is switched on and off at high speed, in accordance with the presence or absence of a resource assignment in OFDMA. Accordingly, it has the effect of reducing the power consumption of a transmission apparatus in a period of time where no resource is used.

The Second Exemplary Embodiment

The second exemplary embodiment of the present invention will be described below. In the first exemplary embodiment, the power consumption control apparatus itself judges the presence or absence of an input by detecting the power of a digital baseband signal, and performs the bias on/off control. Detection of the presence or absence of a digital baseband signal can be performed also by means of another method.

Figure 8:
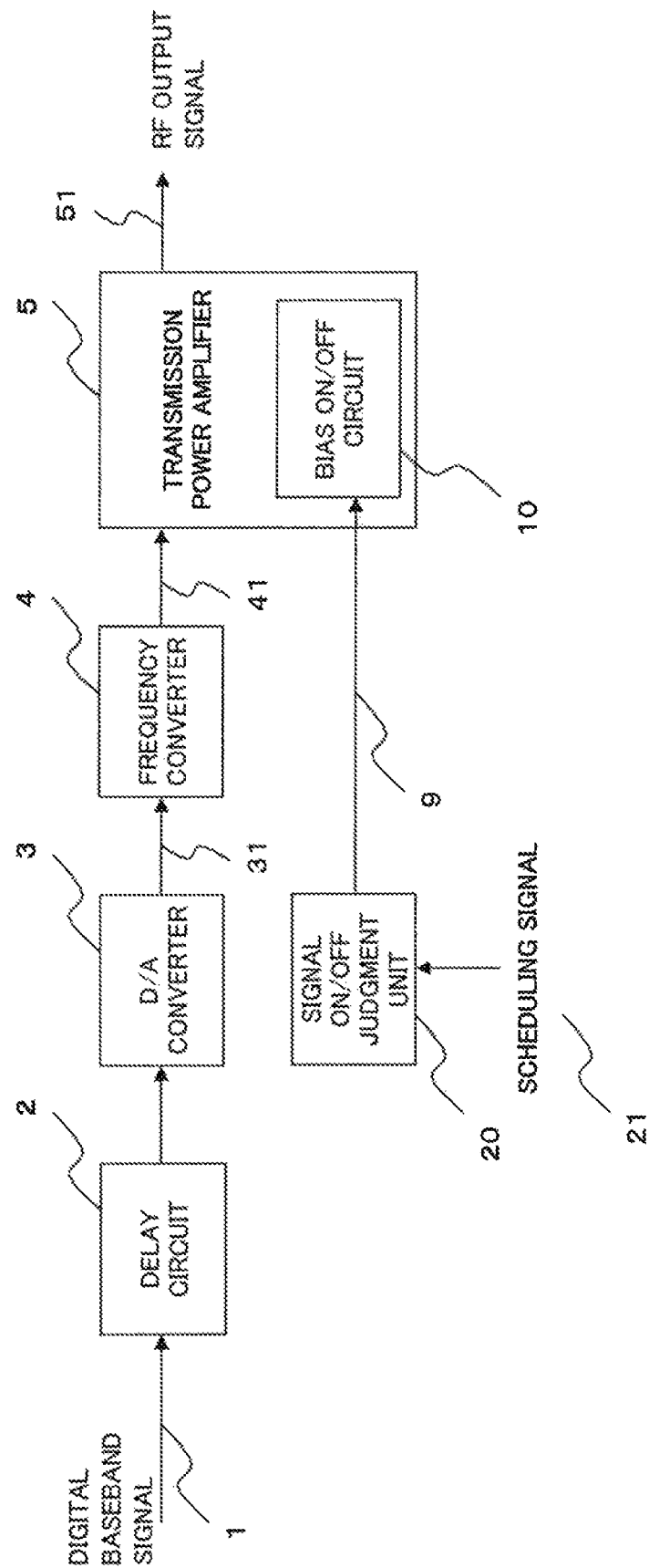
FIG. 8 is a block diagram showing a configuration of a power consumption control circuit of the second exemplary embodiment.

FIG. 8 is a block diagram showing a configuration of a power consumption control circuit of the second exemplary embodiment.

In a power consumption control circuit of the present exemplary embodiment, a signal for performing resource scheduling (referred to as "scheduling signal", hereafter) is received, and the on/off control is performed using the signal. A scheduling signal 1 is received from a superior apparatus of the present power consumption control circuit, that is, an apparatus which is located at a section preceding the power consumption control circuit and inputs a signal to the power consumption control circuit. The scheduling signal 21 is a signal which is transmitted in advance from the superior apparatus, as the information for resource assignment. Because the scheduling signal 21 includes the information for resource assignment, it is possible to judge the presence or absence of an input of the digital baseband signal 1 by the use of the scheduling signal 21. Accordingly, in a signal on/off judgment unit 20, the presence or absence of an input of the digital baseband signal 1 is judged by the use of the scheduling signal 21. Then, the bias on/off circuit 10 is controlled on the basis of the judgment result.

As described above, it is possible to judge the presence or absence of an input of the digital baseband signal 1 also by means of a method using the scheduling signal 21. Accordingly, the power consumption control circuit of the second exemplary embodiment can provide the same effect as the first exemplary embodiment.

Further, it is obvious that the scheduling signal 21 may be used for the detection of a base band signal also in the exemplary embodiments shown in FIGS. 6 and 7, which are currently illustrated to use the power calculation.

Further, the above-described exemplary embodiments can be combined with each other.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese patent application No. 2009-158450, filed on Jul. 3, 2009, the disclosure of which is incorporated herein in its entirety by reference.

INDUSTRIAL APPLICABILITY

The present invention relates to power consumption control of an apparatus, and particularly to a power consumption control circuit, an amplifier circuit and a power consumption control method which can control the power consumption associated with an amplification action in real time, and thus has industrial applicability.

REFERENCE SIGNS LIST

1 Digital baseband signal
2 Delay circuit
3 D/A converter
4 Frequency converter

5 Transmission power amplifier
6 Power calculation unit
7 Comparator
8 Threshold value setting unit
9 Bias on/off signal
10 Bias on/off circuit
10a Switching device for bias application
10b Switching device for bias discharge
10c Discharging resistor
11 RF input terminal
12 MOS field effect transistor
13 Bipolar transistor
14 RF output terminal
15 Gate bias DC power supply
16 Drain bias DC power supply
17 Bias application/discharge switching control circuit
18 Base bias DC power supply
19 Collector bias DC power supply
20 Signal on/off judgment unit
21 Scheduling signal
51 RF output signal

The invention claimed is:

1. A power consumption control circuit comprising:
a detection unit which detects the presence or absence of an input of a digital input signal, spending a first period of time;
a signal delay unit which delays said digital input signal by a second period of time which is equivalent to said first period of time, and outputs the delayed signal;
a digital-analog conversion unit which converts said delayed signal into an analog signal, and outputs the analog signal;
an amplification device which generates an amplification action when a bias is applied to it; and
a bias control unit which applies said bias to said amplification device, on the basis of a detection result obtained by said detection unit, wherein:
said amplification device is a field effect transistor; and
said bias is applied to a gate terminal of said field effect transistor.

2. The power consumption control circuit according to claim 1, wherein:
said bias control unit starts said bias application when the presence of the input of said digital input signal is detected by said detection unit, and suspends said bias application when the absence of the input of said digital input signal is detected by said detection unit.

3. The power consumption control circuit according to claim 2, wherein
said detection unit performs a detection a plurality of times, and said bias control unit starts said bias application when the presence of the input of said digital input signal is detected a first number of times successively by said detection unit, and said bias control unit suspends said bias application when the absence of the input of said digital input signal is detected a second number of times successively by said detection unit.

4. The power consumption control circuit according to claim 1, wherein
said bias control unit suspends said bias application after waiting a third period of time, when the absence of the input of said digital input signal is detected by said detection unit.

5. The power consumption control circuit according to claim 1, wherein
said bias control unit comprises a switching device for bias application which applies a bias voltage to said amplification device, and a switching device for bias discharge which discharges said bias voltage.

6. The power consumption control circuit according to claim 5, wherein:
said switching device for bias application applies a bias voltage to said amplification device, when the presence of the input of said digital input signal is detected by said detection unit; and
said switching device for bias discharge discharges said bias voltage, when the presence of the input of said digital input signal is detected by said detection unit.

7. The power consumption control circuit according to claim 1, wherein
said detection unit performs said detection, on the basis of a comparison result of the power of said digital input signal with a predetermined threshold value for the power.

8. The power consumption control circuit according to claim 7, wherein
said power is obtained on the basis of an average value of instantaneous power of said digital input signal over said first period of time.

9. The power consumption control circuit according to claim 1, wherein
said detection unit performs said detection, on the basis of a comparison result of the amplitude of said digital input signal with a predetermined threshold value for the amplitude.

10. The power consumption control circuit according to claim 9, wherein
said amplitude is obtained, on the basis of an average value of instantaneous amplitude of said digital input signal over said first period of time.

11. The power consumption control circuit according to claim 1, wherein
said detection unit performs said detection, on the basis of a predetermined signal which indicates the presence or absence of said digital input signal.

12. The power consumption control circuit according to claim 1, wherein
said amplification device amplifies said analog signal.

13. The power consumption control circuit according to claim 1, further comprising a frequency conversion unit which converts a frequency of said analog signal.

14. The power consumption control circuit according to claim 1, wherein
said bias control unit comprises;
a switching device for bias application which applies a bias voltage to said amplification device, and
the switching device for bias discharge which discharges said bias voltage.

15. The power consumption control circuit comprising:
a detection unit which detects the presence or absence of an input of digital input signal, spending a first period of time;
a signal delay unit which delays said digital input signal by a second period of time which is equivalent to said first period of time, and outputs the delayed signal;
a digital-analog conversion unit which converts said delayed signal into an analog signal, and outputs the analog signal;
an amplification device which generates an amplification action when a bias is applied to it; and
a bias control unit which applies said bias to said amplification device, on the basis of a detection result obtained by said detection unit, wherein:
said amplification device is a bipolar transistor; and said bias is applied to a base terminal of said bipolar transistor.

16. The power consumption control circuit according to claim 15, wherein
said bias control unit starts said bias application when the presence of the input of said digital input signal is detected by said detection unit, and suspends said bias application when the absence of the input of said digital input signal is detected by said detection unit.

17. The power consumption control circuit according to claim 16, wherein
said detection unit performs a detection a plurality of times, and said bias control unit starts said bias application when the presence of the input of said digital input signal is detected a first number of times successively by said detection unit, and said bias control unit suspends said bias application when the absence of the input of said digital input signal is detected a second number of times successively by said detection unit.

18. The power consumption control circuit according to claim 15, wherein
said bias control unit suspends said bias application after waiting a third period of time, when the absence of the input of said digital input signal is detected by said detection unit.

19. The power consumption control circuit according to claim 15, wherein
said bias control unit comprises a switching device for bias application which applies a bias voltage to said amplification device, and a switching device for bias discharge which discharges said bias voltage.

20. The power consumption control circuit according to claim 19, wherein
said switching device for bias application applies a bias voltage to said amplification device, when the presence of the input of said digital input signal is detected by said detection unit; and
said switching device for bias discharge discharges said bias voltage, when the presence of the input of said digital input signal is detected by said detection unit.

21. The power consumption control circuit according to claim 15, wherein
said detection means performs said detection, on the basis of a comparison result of the power of said digital input signal with a predetermined threshold value for the power.

22. The power consumption control circuit according to claim 21, wherein
said power is obtained on the basis of an average value of instantaneous power of said digital input signal over said first period of time.

23. The power consumption control circuit according to claim 15, wherein
said detection unit performs said detection, on the basis of a comparison result of the amplitude of said digital input signal with a predetermined threshold value for the amplitude.

24. The power consumption control circuit according to claim 23, wherein
said amplitude is obtained, on the basis of an average value of instantaneous amplitude of said digital input signal over said first period of time.

25. The power consumption control circuit according to claim 15, wherein
said detection unit performs said detection, on the basis of a predetermined signal which indicates the presence or absence of said digital input signal.

26. The power consumption control circuit according to claim 15, wherein
said amplification device amplifies said analog signal.

27. The power consumption control circuit according to claim 15, further comprising a frequency conversion unit which converts a frequency of said analog signal.

28. The power consumption control circuit according to claim 15, wherein
said bias control unit comprises;
a switching device for bias application which applies a bias voltage to said amplification device, and
the switching device for bias discharge which discharges said bias voltage.

29. A power consumption control method comprising:
detecting the presence or absence of an input of a digital input signal, spending a first period of time;
delaying said digital input signal by a second period of time which is equivalent to said first period of time, and outputting the delayed signal;
converting said delayed signal into an analog signal and outputting the analog signal; and
applying a bias voltage to an amplification device, on the basis of a detection result obtained by said detecting, and allowing the amplification device to generate an amplification action, wherein:
said amplification device is a field effect transistors; and
said bias is applied to a gate terminal of said field effect transistor.

30. An amplification method comprising;
the power consumption control method according to claim 29, and
amplifying said analog signal using said amplification device.

31. A power consumption control circuit comprising:
a detection means which detects the presence or absence of an input of a digital input signal, spending a first period of time;
a signal delay means which delays said digital input signal by a second period of time which is equivalent to said first period of time, and outputs the delayed signal;
a digital-analog conversion means which converts said delayed signal into an analog signal, and outputs the analog signal;
an amplification means which generates an amplification action when a bias is applied to it; and
a bias control means which applies said bias to said amplification device, on the basis of a detection result obtained by said detection means, wherein:
said amplification device is a field effect transistor; and
said bias is applied to a gate terminal of said field effect transistor.

32. A power consumption control method comprising:
detecting the presence or absence of an input of a digital input signal, spending a first period of time;
delaying said digital input signal by a second period of time which is equivalent to said first period of time, and outputting the delayed signal;
converting said delayed signal into an analog signal and outputting the analog signal; and
applying a bias voltage to an amplification device, on the basis of a detection result obtained by said detecting, and allowing the amplification device to generate an amplification action, wherein:
said amplification device is a bipolar transistor; and
said bias is applied to a base terminal of said bipolar transistor.

33. An amplification method comprising;
the power consumption control method according to claim 32, and
amplifying said analog signal using said amplification device.

34. A power consumption control circuit comprising:
a detection means which detects the presence or absence of an input of a digital input signal, spending a first period of time;
a signal delay means which delays said digital input signal by a second period of time which is equivalent to said first period of time, and outputs the delayed signal;
a digital-analog conversion means which converts said delayed signal into an analog signal, and outputs the analog signal;
an amplification means which generates an amplification action when a bias is applied to it; and
a bias control means which applies said bias to said amplification device, on the basis of a detection result obtained by said detection means, wherein:
said amplification device is a bipolar transistor; and
said bias is applied to a base terminal of said bipolar transistor.

* * * * *